United States Patent
Sikka et al.

(10) Patent No.: US 6,292,367 B1
(45) Date of Patent: Sep. 18, 2001

(54) THERMALLY EFFICIENT SEMICONDUCTOR CHIP

(75) Inventors: Kamal K. Sikka, Poughkeepsie; John U. Knickerbocker, Hopewell Junction; Subhash L. Shinde, Cortlandt Manor, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/599,786

(22) Filed: Jun. 22, 2000

(51) Int. Cl.$^7$ ...................................................... H05K 7/20
(52) U.S. Cl. .................... 361/705; 165/185; 257/713; 361/719
(58) Field of Search .................... 174/252, 16.3, 174/52.3, 52.4; 165/80.3, 185; 428/323, 336, 447, 450; 257/706, 707, 713, 723, 724; 361/704, 705, 706, 717–719, 722, 767, 784

(56) References Cited

U.S. PATENT DOCUMENTS

| | | | |
|---|---|---|---|
| 4,914,551 | * | 4/1990 | Anschel et al. ............... 361/714 |
| 5,931,222 | * | 8/1999 | Toy et al. ....................... 165/80.3 |
| 5,952,719 | * | 9/1999 | Robinson et al. ............. 257/737 |
| 6,104,090 | * | 8/2000 | Unger et al. ................... 257/729 |

* cited by examiner

Primary Examiner—Gerald Tolin
(74) Attorney, Agent, or Firm—Margaret A. Pepper

(57) ABSTRACT

A heat sink assembly and process for fabricating the assembly in which a semiconductor chip is formed with at least one high conductivity layer on its back side and some of the integrated circuits are high power circuits and, during operation, generate "hot spots" of high temperature but, due to the presence of the high conductivity layer, the "hot spots" are dissipated and the maximum chip temperature is lowered to create a uniform and lower temperature across the chip.

13 Claims, 4 Drawing Sheets

THERMALLY EFFICIENT SEMICONDUCTOR CHIP

BACKGROUND OF THE INVENTION

1. Field of the Invention

The present invention relates generally to heat sinks for semiconductor chips and, more particularly, to a semiconductor chip and heat spreading structure to efficiently conduct away the heat generated by the semiconductor chip.

2. Description of the Related Art

Electronic devices and systems, such as computers, consist of semiconductor chips containing integrated circuits and other electronic components, which are mounted on a substrate. With the demand for higher levels of integration in semiconductor chips, more and more circuits are incorporated in the semiconductor chips. This higher level of integration coupled with a reduction in the dimensions of the device or transistor of the integrated circuit produces a semiconductor chip which generates a substantial amount of heat during operation. In addition, the transistors of the integrated circuit are being fabricated to operate faster which further increases the amount of heat generated during operation. One known technique for assisting in reducing heat generated by integrated circuits with the same power during operation of the semiconductor chip is to form a high conductivity layer, such as silicon carbide and diamond, on or adjacent the back of the chip.

However, in scaling down the device size, with advances in lithographic techniques, to increase the number of integrated circuits requires that such a chip contain both low power and high power circuits. Because of this requirement, the heat generated across such a chip is not uniform since the high power circuits generate more heat than the low power circuits and create "hot spots" in the chip. These localized "hot-spots" in the chips result in a non-uniform temperature across the chip which causes excessive chip stresses and can lead to chip failure.

Consequently, there exits a need for thermal solutions that limits the maximum chip temperature and provides an uniform chip temperature across the high/low power integrated circuit chip areas to prevent excessive chip stresses. Therefore, it is an object of the present invention to provide a highly reliable thermal chip structure and process for fabricating such a structure which eliminates hot spots across the chip area. A further object of the present invention is to provide a thermal structure and process for maintaining a more uniform chip temperature across the chip area.

SUMMARY OF THE INVENTION

To achieve the foregoing objects, the present invention is a heat sink or spreading assembly comprising a composite structure of the semiconductor chip layer, having both high and low power circuits formed in the chip with the high power circuits capable of generating "hot spots" during operation, and one or more thermal conductivity layers having a thermal conductivity substantially higher than the chip and a thickness greater than the chip layer. Preferably, the thickness of the high thermal conductivity layers, either individually or combined, are at least about two times thicker than the thickness of the semiconductor chip. The general process for fabricating the composite structure comprises: providing an integrated circuit semiconductor layer of a thickness "x" and containing high power circuits in certain areas of the chip capable of generating a highter temperature than the other circuits of the chip resulting in "hot spots" in these areas during operation of the chip; forming at least one thermal conductivity layer on the back of the semiconductor layer having a substantially higher thermal conductivity than the chip and preferably a thickness at least two times greater than "x" and with a thermal coefficient of expansion similar to the semiconductor chip; and providing heat conduction means to carry the heat away from the semiconductor chip composite, whereby during operation of the chip, the "hot spots" are dissipated and the maximum chip temperature is lowered to create a uniform and lower temperature across the chip. The preferred process for fabricating the composite structure comprises: forming on the backside of a semiconductor wafer, from which fabricated chips with both high and low power circuits will be diced, one or more high thermal conductive layers, removing any of deposited high conductive layers from the front side of the wafer and a sufficient amount of semiconductor material to thin the wafer to a thickness substantially less than the deposited thermal conductive layer. Alternatively, a wafer is fabricated with devices and diced into chips, some of which contain high power circuits capable of generating "hot spot" in the chip during operation. The chips containing such circuits are thinned on their back side and one or more thermal conductivity layers with a thermal conductivity layer substantially higher than the chip and a thickness substantially greater than the chip are bonded to the back side of the thinned chip.

More specifically relative to the preferred process, the semiconductor wafer comprises silicon (Si), gallium arsenide (Ga—As), or silicon germanium (Si—Ge) of a standard thickness on which is deposited a high thermal conductive layer of either β—SiC or diamond or a combination of both. After deposition, the front side of the wafer is lapped and polished to remove any deposited high conductive layer and to thin the semiconductor wafer so that the high conductive layer(s) are substantially thicker than the thinned wafer. devices are now fabricated in the front side of the wafer and contain circuits capable of creating "hot spots" and the wafer is diced into semiconductor chips. The semiconductor chips are mounted on a multilayer ceramic substrate. One or more ceramic substrates are mounted on multilayer printed circuit board to complete a package of highly integrated circuits. The chips mounted face up or front side up and wire bonded to the substrate but, preferably, to increase the chip input/output (I/O) density on the substrate, the semiconductor chips are mounted face down or front side down in a configuration known as flip chip. Area connections with controlled clapsed connected chips (C4) are used on the face of the chip which permits close spacing of the chips on the substrate. Although the flip chip mounting provides the advantage of increased chip I/O density, such mounting presents a more severe problem for dissipating the heat generated by the chips because the heat must be removed from the back of the chips.

BRIEF DESCRIPTION OF THE DRAWINGS

The above summary of the invention and other objects and features of the present invention will become apparent from the following description of preferred embodiments given in conjunction with the accompanying drawings, in which.

DETAILED DESCRIPTION OF THE PREFERRED EMBODIMENTS

Figure 1:
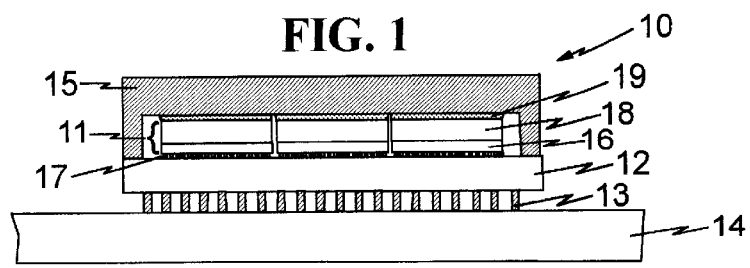
FIG. 1 is a cross sectional view of a package with highly integrated circuits in a plurality of composite flip chips of the present invention mounted on a multi-chip module which, in turn, is mounted on a board.

The present invention will now be described in conjunction with the drawings. Turning to FIG. 1, there is shown a completed heat spreading assembly or integrated circuit package 10 of flip chips composites 11 on a multichip module substrate 12 mounted by pins 13 on a board 14. A heat sink or lid 15 is adjacent the back of the chip to dissipate the heat generated by the chips. The chip composite 11 comprises, in accordance with the present invention, a thin chip 16 with C4s 17 and one or more highly thermal conductive layers 18, thicker than the chip, attached to the heat sink or lid 15, by a thermal interface means 19, herein solder. As a preferred embodiment, the following Table I identifies the various layers, the material of the layer and, most importantly, the thermal conductivity of the material in the heat sink assembly or integrated circuit package 10 of the present invention:

TABLE I

| Package | Dimensions (mm) | Material | Thermal Conductivity (W/mK) |
|---|---|---|---|
| Board (14) | 90 × 90 × 1.6 | Phenolic | 0.3 |
| Pins (13) | 60 × 60 × 2.21 | Kovar Pins | 6 |
| Substrate (12) | 60 × 60 × 2.0 | Alumina | 21 |
| C4 Joints (17) | 15 × 15 × 0.0762 | Lead Alloy | 0.2 |
| Chip (16) | 15 × 15 × 0.25* | Silicon | 110 |
| High Conductivity Layer (18) | 5 × 15 × 0.5* | SiC | 300 |
|  |  | Diamond | 1200 |
| Thermal | 15 × 15 × 0.762 | Lead/Tin | 35 |

TABLE I-continued

| Package | Dimensions (mm) | Material | Thermal Conductivity (W/mK) |
|---|---|---|---|
| Interface (19) | 15 × 15 × 0.0254 | Adhesive | 2 |
| Lid (15) | 60 × 60 × 5 | Copper | 390 |

*When the High Conductivity layer(s) is absent, the Chip layer thickness is 0.75 mm.

Figure 2:
FIG. 2 is an enlarged, relative to FIG. 1, partial cross sectional view of a standard semiconductor wafer for use process of the present invention.
Figure 3:
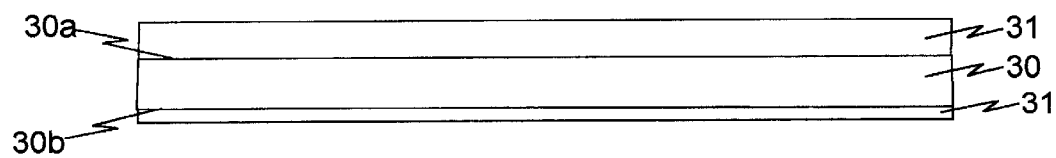
FIG. 3 is a cross sectional view of the wafer of FIG. 2 with a high thermal conductivity layer primarily on the back of the wafer but also partially on the front of the wafer.
Figure 4:
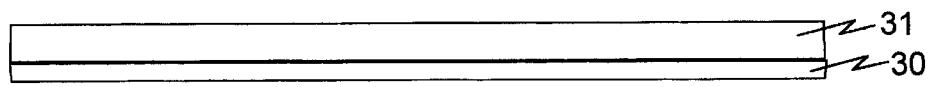
FIG. 4 is a cross sectional view of the wafer of FIG. 3 with the conductivity layer on the front of the wafer removed along with a sufficient amount of the front of the wafer so that the combination of the wafer thickness and the conductivity layer thickness is about the same as the thickness of the wafer of FIG. 2.
Figure 7:
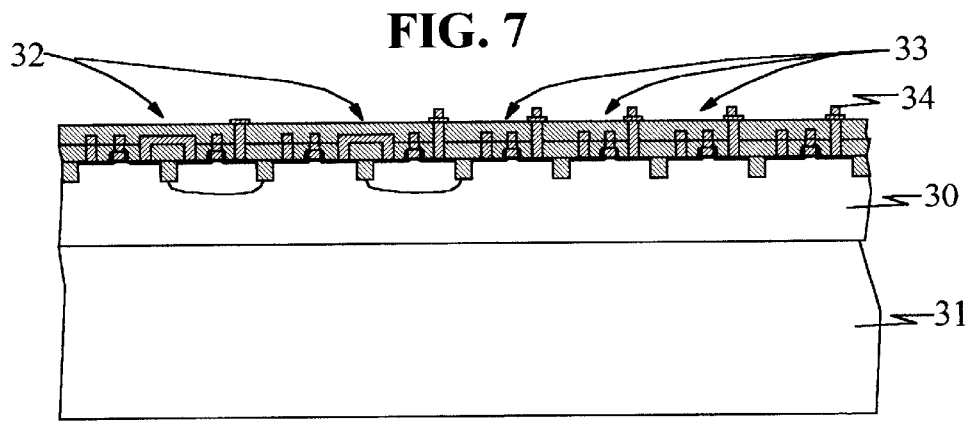
FIG. 7 is an enlarged cross sectional view of part of the wafer and conductivity layer of FIG. 4 with wafer fabricated with high power and low power electronic devices.
Figure 8:
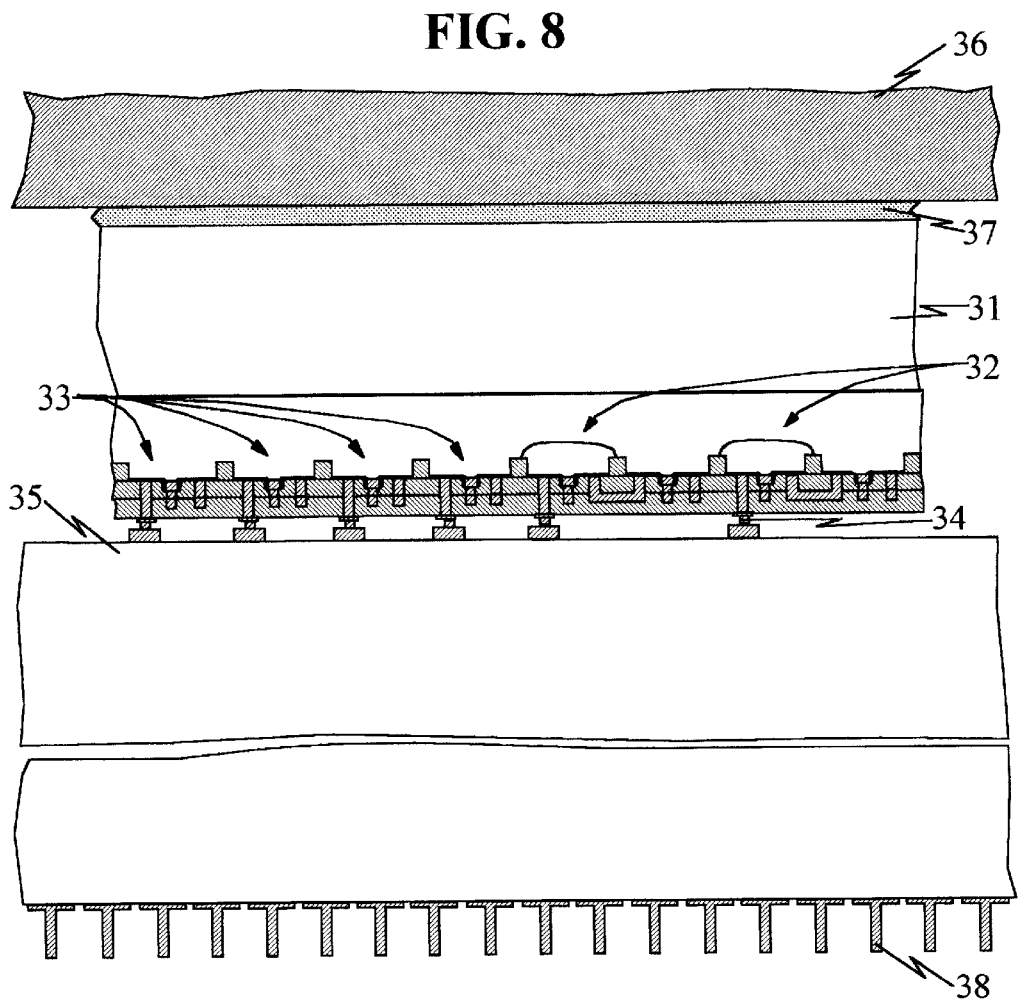
FIG. 8 is an enlarged cross sectional view of the fabricated wafer and conductivity layer of FIG. 7 mounted front side down and connected with C4 joints on a substrate.
Figure 9:
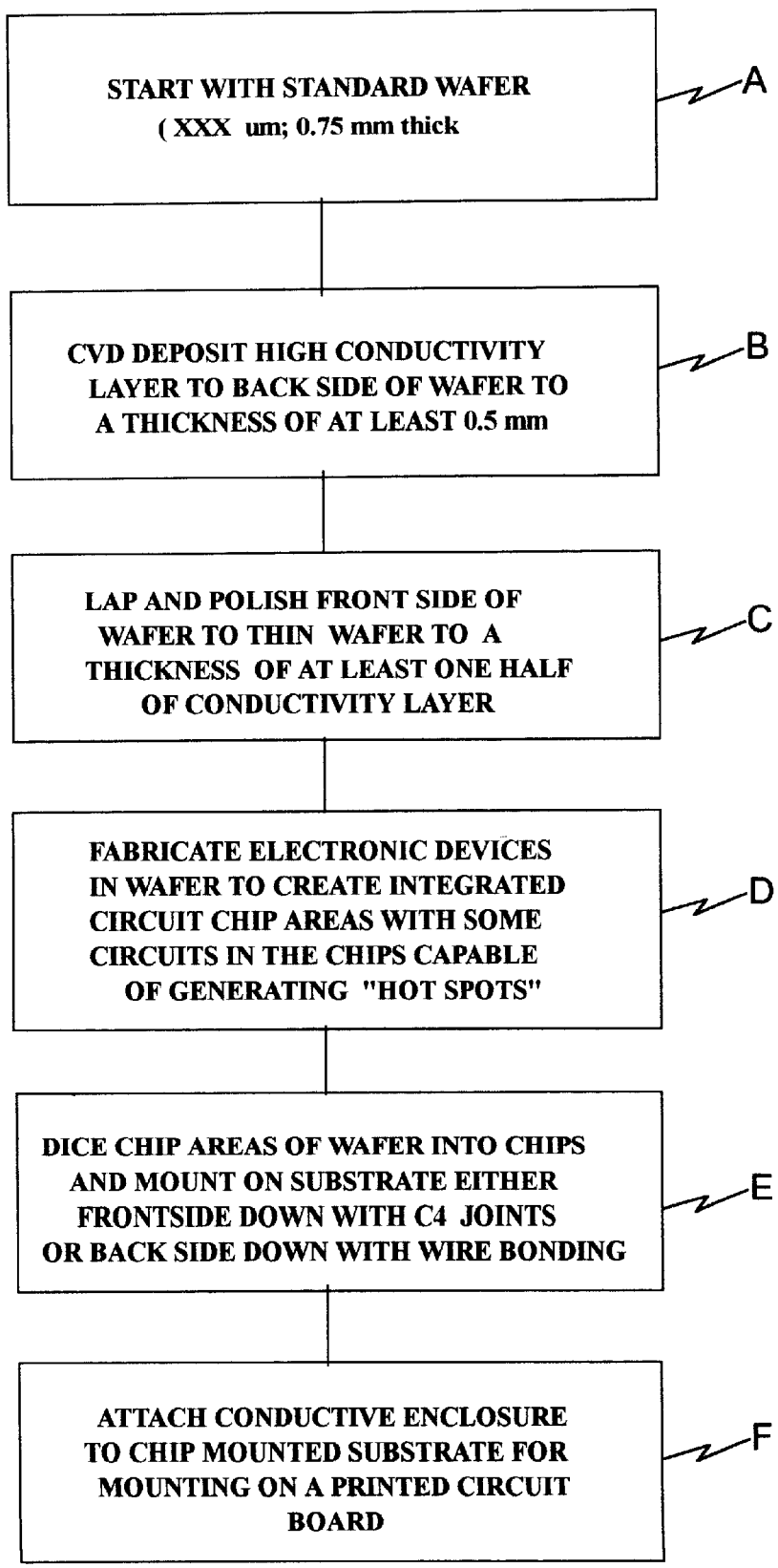
FIG. 9 is a flow diagram of the steps of the preferred process of fabrication of the present invention.

The preferred process for fabricating the composite 11 (FIG. 1) of the present invention of the heat sink assembly or integrated circuit package 10 (FIG. 1) is illustrated in the cross-section FIGS. 2–8 and the flow diagram FIG. 9. The starting material is a semiconductor wafer 30, which can be silicon, gallium arsenide (GaAs) or silicon-germanium (Si—Ge) as shown in FIG. 2 and described in Box A of FIG. 9, of a standard thickness, herein 0.75 mm, on which is formed, after proper surface preparation, a high thermal conductivity layer 31 by either chemical vapor depositing (CVD) silicon carbide (β—SiC) or diamond as a single layer, as shown in FIG. 3 and described in Box B of FIG. 9, primarily on the back side 30a of the wafer 30. In CVD depositing either the silicon carbide or diamond, the front side 30b of the wafer 30 becomes partially coated. Since the front side of the wafer is to be fabricated with electronic devices such as transistors, the thermal conductivity layer 31 must be removed by lapping and polishing. In addition, in accordance with the present invention, the thickness of the semiconductor wafer 30 must be decreased so that the thickness of the thermal conductivity layer 31 is at least about two times the thickness of the semiconductor wafer as shown in FIG. 4 and as described in Box C of Fig. Herein, the thermal layer 31 is deposited to a thickness of about 0.5 mm so that the wafer 30 is then lapped and polished to a thickness of the about 0.25 mm or a composite thickness of about 0.75 mm. Instead of lapping and polishing the wafer 30 to reduce its thickness, a thin wafer, such as one about 0.25 mm can be used as the starting wafer.

Figure 5:
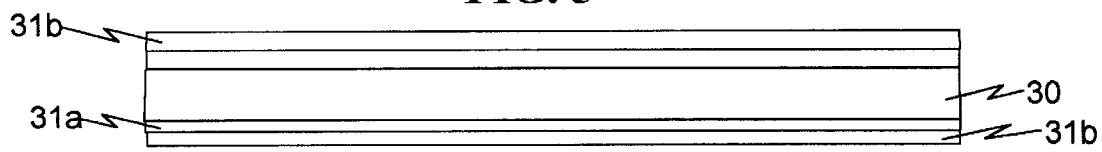
FIG. 5 is a cross sectional view of the wafer of FIG. 2 with of two high thermal conductivity layers of different materials primarily on the back of the wafer but also partially on the front of the wafer.
Figure 6:
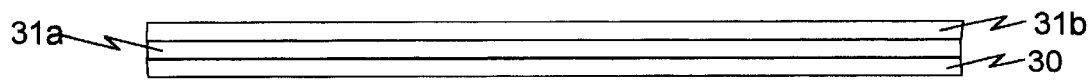
FIG. 6 is a cross sectional view of the coated wafer of FIG. 5 with the conductivity layers on the front of the wafer removed along with a sufficient amount of the front of the wafer so that the combination of the wafer thickness and the two conductivity layers thickness is about the same as the thickness of the wafer of FIG. 2.

Alternatively, as shown in FIGS. 5 and 6, the thermal conductivity layer 31 can be a combination of a layer of silicon carbide 31a and a layer of diamond 31b. As shown in FIG. 5, the starting wafer 30 of FIG. 2 is formed with silicon carbide 31a by CVD deposition to one-half the desired thickness of the combination of the two layers, followed by CVD deposition of an about equal thickness of diamond 31b. Although the combination of the two layers are shown to essentially equal in thickness, this is not required and the layer with the highest thermal conductivity (W/mK) may be the thickest of the two layers. The preferred order of deposition on the semiconductor wafer 30 is silicon carbide followed by diamond because the coefficient of expansion is a more closer match to silicon than diamond. However, if desired, the order can be reversed and the diamond layer 31b can be in contact with the wafer 30. Again, the front side 30b wafer 30 is lapped and polished to remove the silicon carbide and diamond layers and to thin the wafer so that the thickness of the combined layers 31a and 31b are at least about two times the thickness of the semiconductor wafer 30.

To be more specific as to the CVD deposition of the thermal conductivity layer, it is known that silicon carbide can be deposited in a CVD deposition chamber (not shown) at an operating temperature between 600 and 1000° C. by first reacting methane gas with hydrogen gas in preferably a ratio of 10% methane gas and 90% hydrogen gas. Then, silane gas is slowly added to the flow of methane and hydrogen. The flow of methane is gradually decreased and the flow of silane is gradually increased and the rate each of these gases are changed will control the composition of the silicon carbide. Herein, the flow of the silane gas is increased at a rate of 2% per minute and the flow of the methane and hydrogen gases is decreased at a rate of 1% per minute. CVD deposition also is well known at temperatures ranging from 600 to 950° C. with methane or acetylene used as the carbon source and significant partial pressure of atomic hydrogen. Excitation sources used to create the plasma during deposition may be either microwave or radio frequency.

After the lapping and polishing of the front side of the wafer 30, the wafer is fabricated with electronic devices which are connected together to form integrated circuits by conventional semiconductor processing. As shown in FIG. 7 and described in Box D of FIG. 9, an enlarged cross section of the wafer 30 with the high conductivity layer 31 is fabricated with low power CMOS field effect transistors (FET) 32 and high power transistors circuits 33, herein NMOS FETs. Instead of high power FET circuits, bipolar transistor circuits (not shown), which are even higher power circuits and generate more heat than FETs, may be required for the integrated circuit application. Without the high conductivity layer 31 of the present invention, the high power transistor circuits 33 during operation will generate "hot spots" in the semiconductor chip 30. Once the devices are formed in the wafer along with C4 34 joints for connection to a substrate, the wafer is diced into chips and the chips are mounted in flip-chip fashion on the substrate 35 as shown in FIG. 8 and as described in the Box E of FIG. 9. As shown in FIG. 8, and as described in Box F FIG. 9, the chips are enclosed on the substrate with a heat conductive means 36, herein a copper lid adhered to the back of the high conductivity layer 31 by a thermal interface material 37, herein, a thin layer of solder. Pins 38 are affixed to the back of the substrate for mounting the substrate on a printed circuit board. Because of the high conductivity layer 31, the "hot spots" capable of being created by the high power integrated circuits 33 will be dissipated and the temperature gradient across the chip 30.

To establish that the higher thermal conductivity layer(s) 31 on the back of the chip 30 will provide effective spreading of localized hot-spots and significantly decrease the temperature gradient across the chip, three different power distributions cases, CASE I, CASE II and CASE III were generated to determine chip temperature distributions. Each back side of the three chips was divided into a 5×5 array with power independently applied in watts (W) to each unit of the array as shown in following table:

TABLE II

| CASE I | | | | | CASE II | | | | | CASE III | | | | |
|---|---|---|---|---|---|---|---|---|---|---|---|---|---|---|
| 4 | 4 | 4 | 4 | 4 | 8.5 | 1 | 1 | 1 | 8.5 | 8.5 | 1 | 1 | 1 | 8.5 |
| 4 | 4 | 4 | 4 | 4 | 1 | 6 | 6 | 6 | 1 | 1 | 7.5 | 3 | 7.5 | 1 |
| 4 | 4 | 4 | 4 | 4 | 1 | 6 | 6 | 6 | 1 | 1 | 3 | 12 | 3 | 1 |
| 4 | 4 | 4 | 4 | 4 | 1 | 6 | 6 | 6 | 1 | 1 | 7.5 | 3 | 7.5 | 1 |
| 4 | 4 | 4 | 4 | 4 | 8.5 | 1 | 1 | 1 | 8.5 | 8.5 | 1 | 1 | 1 | 8.5 |

In all cases, the total chip power dissipation was 100 W. As shown in the Table, uniform chip power was generated in CASE I whereas, in CASE II, the power at the chip corners and center were sufficiently high to create "hot spots" and, in CASE III, the power diagonally across the chip was sufficient high to create "hot spots". For each power case, three different chip configurations were evaluated as shown in Table III. In CASE A, the thickness of the silicon chip was 0.75 mm and without a thermal conductivity layer, whereas, in CASE B, the thickness of the silicon chip was 0.25 mm with a 0.5 mm thick layer of silicon carbide on the back of the chip, and, CASE C, the thickness of the silicon chip was 0.25 mm with a 0.5 thick layer of diamond on the back of the chip.

TABLE III

| | CASE I | | CASE II | | CASE III | |
|---|---|---|---|---|---|---|
| | $T_j$ | $\Delta T$ | $T_j$ | $\Delta T$ | $T_j$ | $\Delta T$ |
| CASE A | 70.6 | 3.3 | 75.9 | 13.7 | 76.9 | 13.5 |
| CASE B | 69.4 | 2.6 | 73.4 | 10.4 | 73.9 | 10.9 |
| CASE C | 68.2 | 1.3 | 70.7 | 5.9 | 70.9 | 5.9 |

The results presented in Table III are in terms of maximum chip temperature and the temperature delta between the maximum and minimum chip temperature. It is evident in reviewing the results that the high conductivity layer 31 on the back-side of the chip not only lowers the maximum chip temperature, but also decreases the temperature gradient across the chip, thereby spreading or dissipating the "hot spots" in the chip and reducing the stresses caused by the "hot spots".

Figure 10:
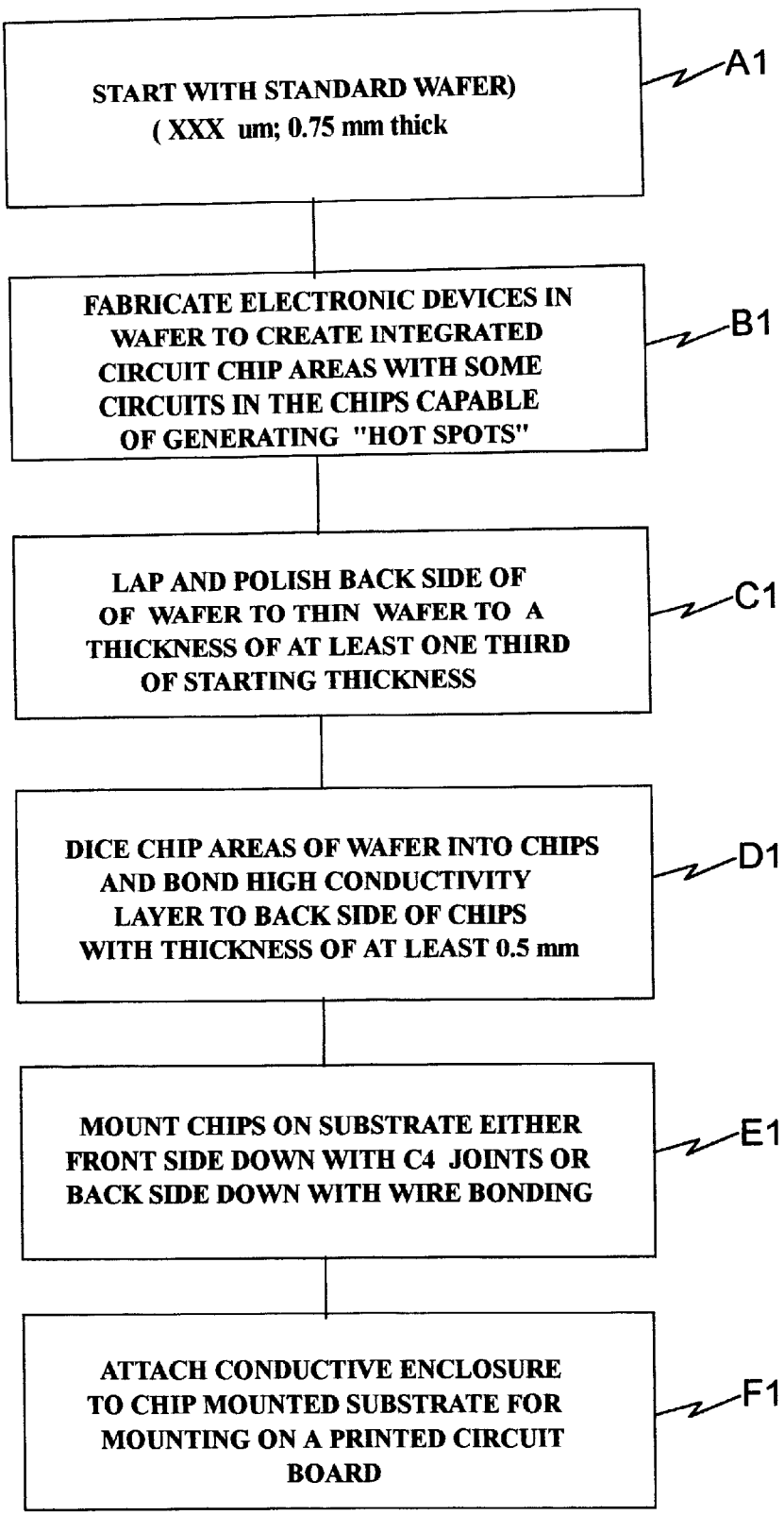
FIG. 10 is a flow diagram of the steps of the alternative process of fabrication of the present invention.

Turning now to the flow diagram of FIG. 10, an alternative fabrication process is described in which a semiconductor wafer is fabricated with electronic devices in the conventional manner except that some of the circuits in the chip area of the wafer generate substantially more heat than the other circuits and create "hot spots" as described in Box A1 and B1 of FIG. 10. After the wafer is fabricated, the back of the wafer is lapped and polished to thin the wafer to at least one-half of its thickness as described in Box C1 of FIG. 10. Another option is to scribe and dice the wafer into chips and to lap and polish the back of the individual chips to thin the chips to at least one-half of their thickness. Because of the size of the wafer relative to the chip, thinning of the wafer is preferred. A thermal conductivity layer or a combination of layers essentially equal in size to the size of the chip are first formed as free standing and then are bonded to the back of the chip as described in Box D1 of FIG. 10. Preferably, the thickness of the thermal conductivity layer(s) is at least about two times the thickness of the thinned chip. Diffusion or thermo-compression bonding are used to bond the thermal conductivity layer(s) to the back of the semiconductor chip at a temperature in the range of about 200° C. to about 600° C. Reactive bonding also may be used to bond the thermal conductivity layer(s) to the back of the semiconductor chip. Alternatively, the thermal conductivity layer(s) may be adhered to the back of the semiconductor chip with a thin solder layer or a thin adhesive.

The remaining step of the alternative process are same as the preferred process and entail mounting the chips on a substrate and adhering a heat sink or lid to the back of the high conductivity layer as described in Boxes E1 and F1 of FIG. 10 and as shown in FIG. 8.

Although the invention of the present invention is can be used in conventional chip mounting with the chip and its integrated circuit connections face up, it provides particular advantage to a flip chip mounting in which is the chip face, with the contacts of the integrated circuits, including the circuits capable of generating "hot spots", are mounted face down. The contacts are formed of an alloy, such as lead/tin, which, when melted, will reflow and maintain their location on the chip and are commonly know as Controlled Collapse Chip Connection (C4) joints. When attaching flip chips to a module, the chips are positioned on pads on the module and the module carrying the chips are passed through a furnace at a temperature sufficient to melt the alloy of each C4 joint and reflow it to the respective pads on the module. Upon cooling the chips will be physically and electrically connected to the module. Because the flip chips with C4 joints permit area connection, or contacts across the face area of the chip, to the module, the chips can be spaced so closely together on the module that they prevent a severe problem in dissipating the heat generated by the chips and in maintaining an uniform temperature gradient across the chips.

Although this invention has been described relative to particular embodiments, it will be apparent to those skilled in the art that various changes and modification may be made without departing from the spirit and scope of the invention as defined in the following claims.

Having thus described the invention, what is claimed is:

1. In a heat spreading assembly for removing heat generated by at least one integrated circuit semiconductor chip and for maintaining an uniform temperature across the chip comprising:
   an integrated circuit semiconductor chip of a thickness "x" and containing high power circuits in certain areas of the chip capable of generating a higher temperature than the other circuits of the chip and creating "hot spots" in these areas; and
   at least one continuous thermal conductivity layer comprising a single thermal conductivity material selected from the group consisting of silicon carbide and diamond in physical contact with the back of the chip having a substantially higher thermal conductivity than the chip and a thickness greater than "x" and with a thermal coefficient of expansion similar to the semiconductor chip, whereby during operation of the chip, the "hot spots" are dissipated and maximum chip temperature is lowered to create a uniform and lower temperature across the chip.

2. The heat spreading assembly of claim 1 wherein the thermal conductivity of the thermal conductivity layer is at least about 300 W/mK and wherein the thickness of the thermal conductivity layer is at least two times greater than "x".

3. The heat spreading assembly of claim 1 wherein the thermal conductivity layer is silicon carbide.

4. The heat spreading assembly of claim 1 wherein the thermal conductivity layer is diamond.

5. The heat spreading assembly of claim 1 wherein the thermal conductivity layer is composite of a diamond layer on top of a silicon carbide layer.

6. The heat spreading of claim 1 wherein a bonding interface is disposed between the thermal conductivity layer and the semiconductor chip so as to bond the layer to the chip.

7. A heat spreading assembly for removing heat generated by at least one integrated circuit semiconductor chip and for maintaining a more uniform temperature across the chip comprising:
   a printed circuit board having conductive pads for receiving conductive pins of at least one chip carrier substrate;
   a chip carrier substrate mounted on said board and enclosed in a thermal conductivity lid;
   at least one integrated circuit semiconductor chip, of a thickness "x" and containing high power circuits in certain areas of the chip capable of generating greater heat than the other circuits of the chip and creating "hot spots" in these areas, connected to and mounted on said substrate within the lid; and
   at least one thermal conductivity layer in physical contact with the back of the chip having a substantially higher thermal conductivity than the chip and a thickness at least two time greater than "x" and with a thermal coefficient of expansion similar to the semiconductor chip, whereby during operation of the chip in the heat spreading assembly, the "hot spots" are dissipated and the maximum chip temperature is lowered to create a uniform and lower temperature across the chip.

8. The heat spreading assembly of claim 7 wherein the front of the chip is connected to the substrate with C4 joints and the thermal conductivity layer is adjacent the lid.

9. The heat spreading assembly of claim 7 wherein the thermal conductivity layer is mounted on the substrate and the front of the chip is wire bonded to the substrate and adjacent the lid.

10. The heat spreading assembly of claim 7 wherein the thermal conductivity of the thermal conductivity layer is at least about 300 W/mK and wherein the thickness of the thermal conductivity layer is at least two times greater than "x".

11. The heat spreading assembly of claim 7 wherein the thermal conductivity layer silicon carbide.

12. The heat spreading assembly of claim 7 wherein the thermal conductivity layer is diamond.

13. The heat spreading assembly of claim 7 wherein the thermal conductivity layer is a composite of a diamond layer on top of a silicon carbide layer.

* * * * *